(12) United States Patent
Hwang

(10) Patent No.: US 8,715,015 B2
(45) Date of Patent: May 6, 2014

(54) STRUCTURE FOR A SPRING CONTACT

(75) Inventor: Dong Weon Hwang, Seoul (KR)

(73) Assignee: Hicon Co., Ltd., Gyeonggi-do (KR)

( * ) Notice: Subject to any disclaimer, the term of this patent is extended or adjusted under 35 U.S.C. 154(b) by 60 days.

(21) Appl. No.: 13/521,233

(22) PCT Filed: May 11, 2011

(86) PCT No.: PCT/KR2011/003447
§ 371 (c)(1),
(2), (4) Date: Jul. 10, 2012

(87) PCT Pub. No.: WO2011/149203
PCT Pub. Date: Dec. 1, 2011

(65) Prior Publication Data
US 2013/0012076 A1 Jan. 10, 2013

(51) Int. Cl.
*H01R 13/24* (2006.01)
(52) U.S. Cl.
CPC .................... *H01R 13/2421* (2013.01)
USPC .......................................................... 439/700
(58) Field of Classification Search
CPC ............................ H01R 23/722; H01R 13/2421
USPC ................................................. 439/700, 824
See application file for complete search history.

(56) References Cited

U.S. PATENT DOCUMENTS

| 7,025,602 | B1 | 4/2006 | Hwang |
| 7,815,440 | B2 | 10/2010 | Hsieh et al. |
| 8,262,419 | B2 * | 9/2012 | Chen et al. ................ 439/700 |
| 8,408,946 | B1 * | 4/2013 | Sochor ..................... 439/700 |
| 2006/0073710 | A1 | 4/2006 | Hwang |
| 2007/0212948 | A1 * | 9/2007 | Zuo ........................... 439/700 |
| 2010/0035483 | A1 | 2/2010 | Hsieh et al. |
| 2012/0238136 | A1 * | 9/2012 | Hwang .................. 439/607.01 |

FOREIGN PATENT DOCUMENTS

| KR | 10-2006-0030785 A | 4/2006 |
| KR | 10-2008-0015512 A | 2/2008 |

* cited by examiner

*Primary Examiner* — Phuong Dinh
(74) *Attorney, Agent, or Firm* — Rabin & Berdo, P.C.

(57) ABSTRACT

A spring contact, including: an upper contact pin having a contact portion, a head, a neck, a body and two spring holding protrusions; a lower contact pin having a construction that is the same as or similar to that of the upper contact pin and being coupled to the upper contact pin while crossing at right angles; and a spring fitted over an assembly of the upper and lower contact pins, wherein to increase the strength of the upper contact pin and increase the surface area of the contact portion, the head forms a cylindrical or square column shape or a part of the contact pin within the range from the contact portion to the spring holding protrusions has a thickness greater than the thickness of the body, thereby increasing the strength of the upper contact pin and increasing the surface area of the contact portion.

37 Claims, 30 Drawing Sheets

-Prior Art-

-Prior Art-

-Prior Art-

STRUCTURE FOR A SPRING CONTACT

TECHNICAL FIELD

The present invention relates, in general, to a structure of a spring contact and more particularly to a spring contact which is embedded in a test socket that is used to test the performance of an integrated circuit (IC) and connects each of a plurality of leads of the IC to an associated one of a plurality of pads of a PCB, and relates to a spring contact which electrically connects each of the leads of an IC of a CPU to a PCB of an electronic appliance, such as a personal computer (PC) or a mobile phone, and relates, more generally, to a structure of a spring contact which electrically connects two sides to each other.

BACKGROUND ART

As shown in FIG. 1, a conventional spring contact includes an upper contact pin 2, a lower contact pin 4 and a spring 3, in which the upper and lower contact pins are produced using a plate-shaped material. The spring contact is an important element of an IC test socket, in which the spring contact functions to electrically connect a lead of the IC to a PCB.

Hereinbelow, the construction, operational function and problems of the conventional spring contact will be described in detail with reference to FIGS. 2 through 6b.

As shown in FIGS. 2 and 3, the conventional spring contacts are important elements of a socket 14, in which the spring contacts are installed in a nonconductive plastic molded socket body in such a way that the spring contacts have predetermined intervals, locations and heights, and come into contact with leads 12 of a semiconductor IC 11 that is a material subjected to a test, thereby performing the function of testing the IC.

The conventional spring contact includes: an upper contact pin which is provided with a contact portion that has a predetermined shape, two spring holding protrusions that are provided in left and right sides of the contact pin and limit the length of an assembled spring and prevent the assembled spring from becoming displaced, a spring holding surface that is formed by the two spring holding protrusions, and a body; a lower contact pin that is coupled to the upper contact pin in such a way that the upper and lower contact pins cross each other at right angles; and a spring 3 that is fitted over an assembly of the upper and lower contact pins 2 and 4 at a position between the upper and lower contact pins. Here, the body has two symmetric elastic portions, each of which has an oblique surface, a contact surface and a locking protrusion on an end thereof. A moving slit is formed between the two elastic portions and forms a moving space in which the lower contact pin can move, with a stop surface formed on an end of the moving slit, so that the moving slit movably receives the locking protrusions of the lower contact pin. The body further has a moving opening, which makes electric contact with the contact surfaces of the locking protrusions of the lower contact pin. Here, one end of the moving opening forms a stop bridge and the other end extends to the spring holding surface which is formed by the two left and right spring holding protrusions that function to limit the length of the assembled spring and to prevent the spring from undesirably becoming displaced.

The conventional spring contact is configured in such a way that the body of each of the upper and lower contact pins has a constant thickness within the range of up to the two elastic portions. Here, the thickness of the body within the range of up to the upper contact portion is typically determined to be about ⅓ of the width of the body and this is because a characteristic of the conventional spring contact is that the width of each of the two elastic portions and the width of the moving opening are determined to be almost equal to the thickness thereof.

A first problem that is experienced in the structure of the contact pins of the conventional spring contact, in which the thickness of each contact pin is determined to be about ⅓ of the width of the contact pin, resides in that a protruding part of the spring contact which protrudes from the molded socket body as shown in FIGS. 2 and 3 may be easily broken, as illustrated in FIG. 4.

A second problem of the conventional spring contact is caused by the structure of the contact pins and lies in that when the leads of an IC deviate from the contact portions of the contacts by about 0.15 mm during a practical IC test performed with a 0.5 mm pitch IC and a 0.5 mm pitch socket, in which the diameter of IC balls that function as the leads of the IC is 0.3 mm and the width and thickness of the contact portions of the contacts are 0.26 mm and 0.08 mm, respectively, the contact portions of the contacts do not deviate from the balls in a width direction of the contact pins of the conventional spring contacts; however, the contact portions of the contacts deviate from the balls in the thickness direction of the contact pins, as shown in FIGS. 6a and 6b. In the above state, the contact pins may break the IC balls or the contact portions may be form a bad contact with the balls, thereby causing bad test results.

DISCLOSURE

Technical Problem

Accordingly, the present invention has been made keeping in mind the above problems occurring in the related art, and is intended to provide a spring contact that can solve the problems of the conventional spring contact, in which the thickness of a contact portion of the conventional spring contact is ⅓ of the width of the contact portion so that the contact becomes structurally weak and may be easily broken, and in which the contact portion of the conventional spring contact may easily deviate from an IC ball or easily break the IC ball, and, accordingly, the present invention can provide various types of spring contacts.

Technical Solution

To solve the above-mentioned technical problem, the present invention provides a structure of a spring contact, which includes: an upper contact pin that has a plate shape and a predetermined body thickness t, and is provided with a contact portion of a predetermined shape, a head, a neck and two spring holding protrusions that are provided in left and right sides of the contact pin so as to limit a length of an assembled spring and prevent the spring from undesirably becoming displaced, and a body; a lower contact pin that is coupled to the upper contact pin in such a way that the upper and lower contact pins cross each other at right angles, the lower contact pin having a construction that is the same as or similar to that of the upper contact pin; and a spring that is fitted over an assembly of the upper and lower contact pins at a position between the upper and lower contact pins, wherein the head of each of the upper and lower contact pins may be configured to form a cylindrical shape, in which the contact portion formed in the end of the head is provided with a plurality of contact protrusions at locations around the edge of the end of the cylindrical head, or the head of the contact pin may be configured to form a square column shape or a polygonal column shape, in which the contact portion formed in the end of the head is provided with a plurality of contact protrusions, or the contact pin may be configured in such a way that the thickness t2 of a part of the contact pin within a range from the contact portion to the two left and right spring holding protrusions is greater than the thickness t of both the body and elastic portions, thereby overcoming the problems of the conventional spring contact, in which the spring contact may be easily broken or the contact portion of the contact pin may easily deviate from an IC ball and breaks the IC ball or causes a bad contact between the contact portion and the IC ball.

Advantageous Effects

As described above, the present invention is advantageous in that it can provide a spring contact which can solve the two problems of the conventional spring contact, thereby providing a spring contact that has increased structural strength and does not easily break compared to the conventional spring contact, and which can provide a large contact surface area relative to an IC ball during a test so that the spring contact can realize a good contact with the IC ball during a practical test even when the IC ball deviates from the center of the contact portion of the contact by 0.15 mm, thereby providing a spring contact structure capable of realizing an improved test yield.

Figure 1:
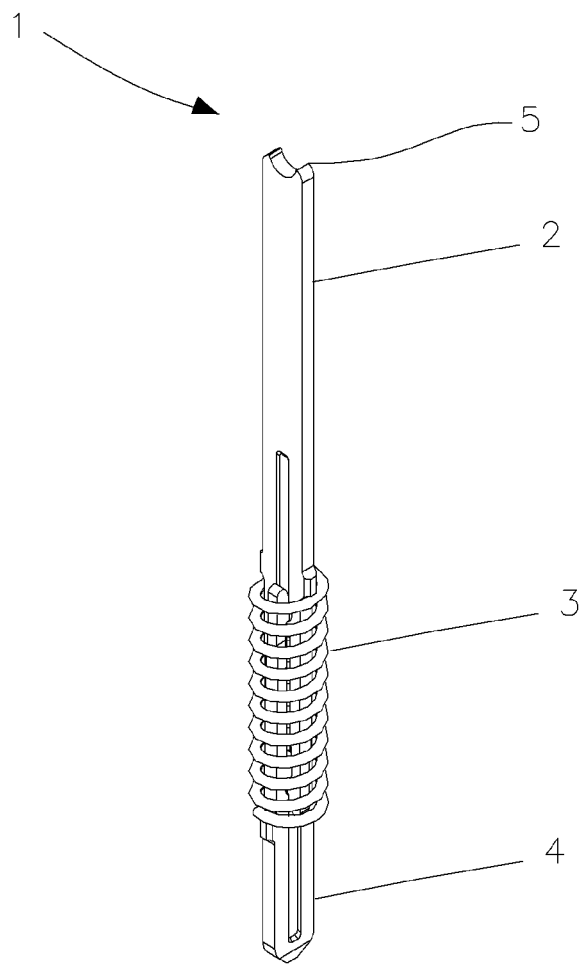
FIG. 1 is a view illustrating a conventional spring contact.
Figure 2:
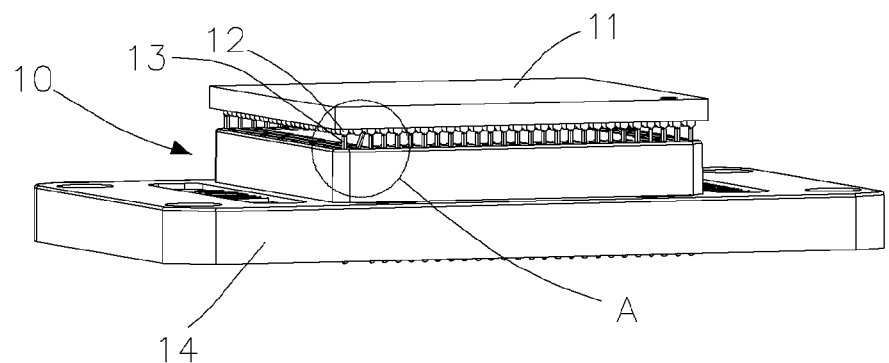
FIG. 2 is a view illustrating a BGA (ball grid array) IC and a socket equipped with conventional spring contacts.
Figure 3:
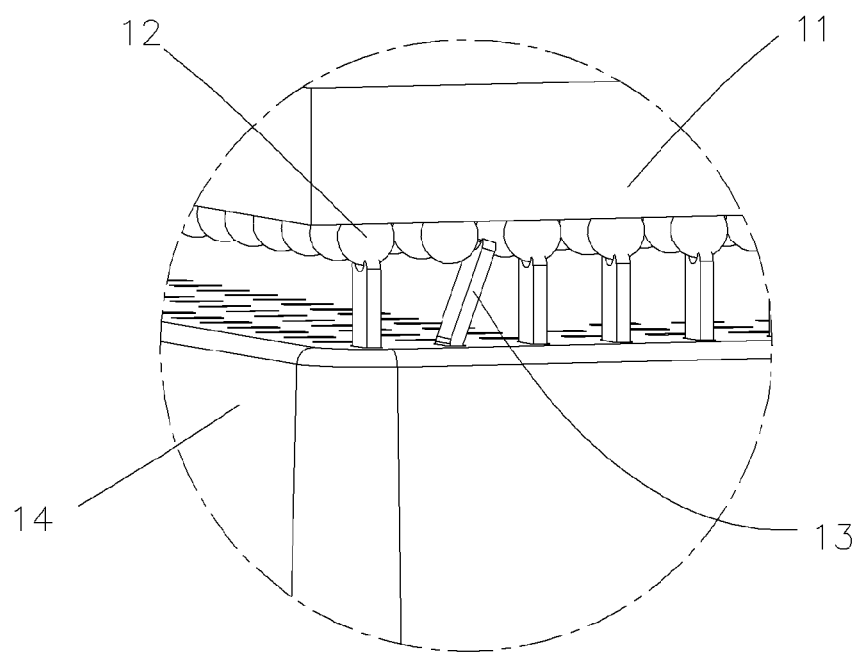
FIG. 3 is a view illustrating the construction of portion A of FIG. 2 in detail.
Figure 4:
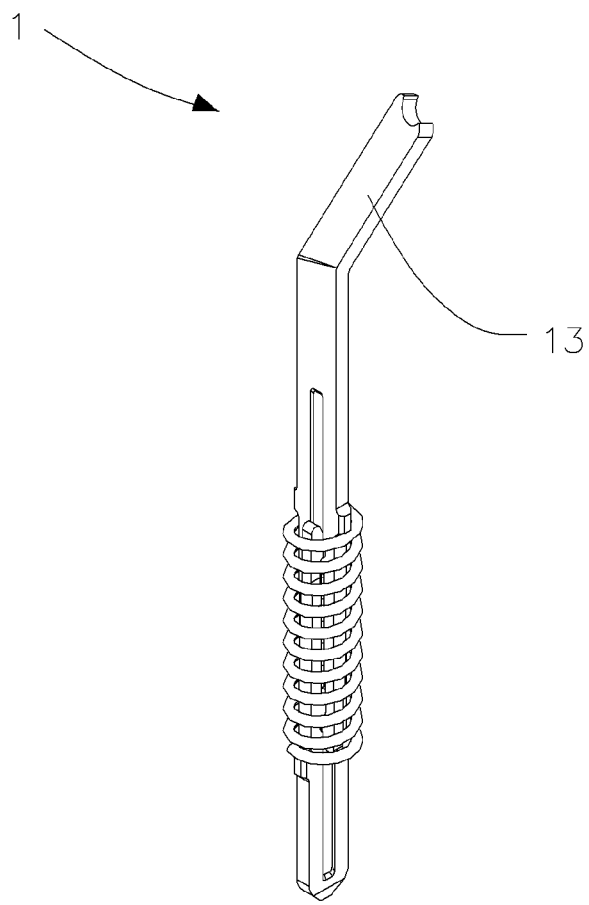
FIG. 4 is a view illustrating breakage of the conventional spring contact, which is the first problem of the conventional spring contact.
Figure 5:
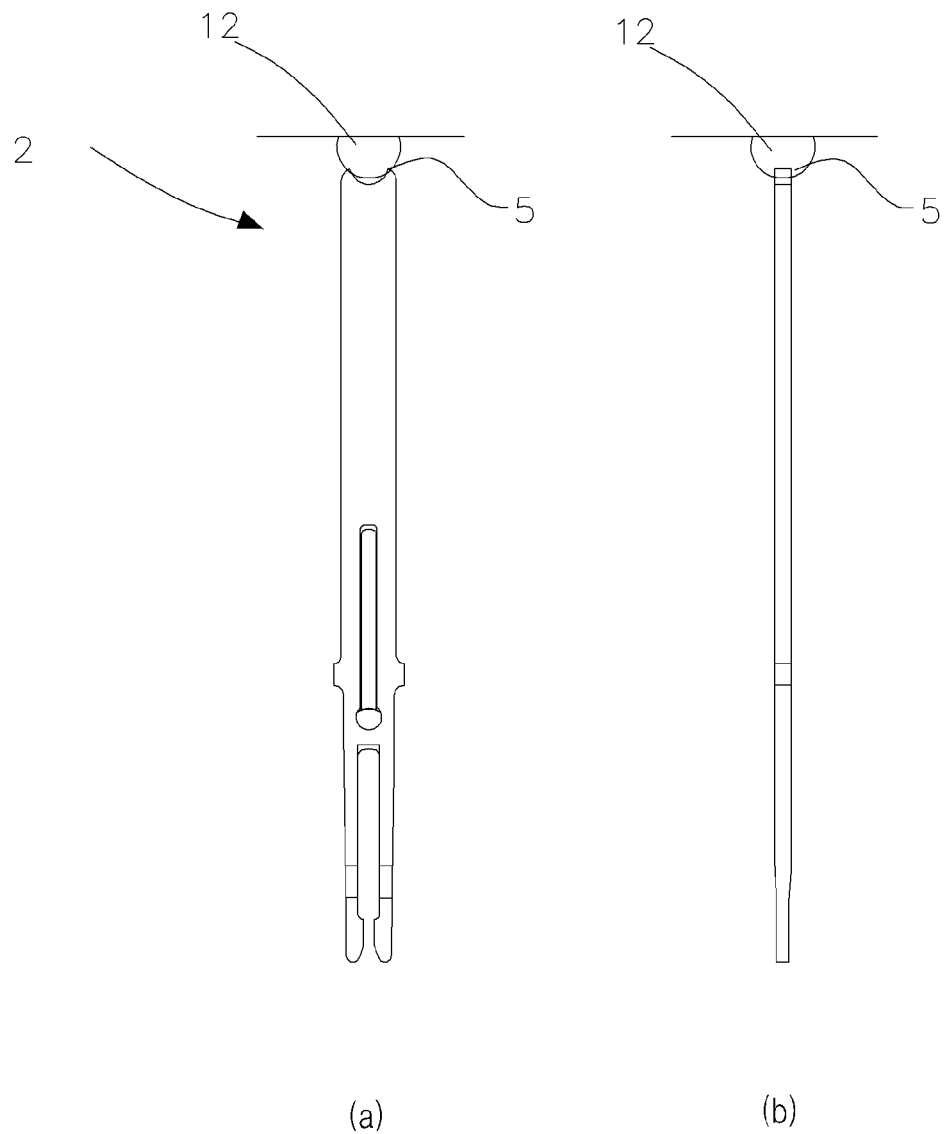
FIG. 5a is a front view illustrating a normal contact between the conventional spring contact and an IC ball.
FIG. 5b is a side view illustrating the normal contact between the conventional spring contact and the IC ball.
Figure 6:
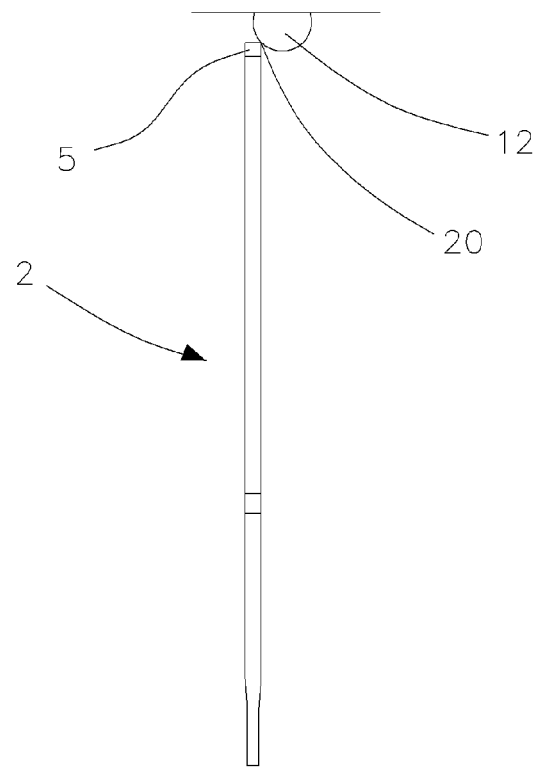
FIG. 6a is a side view illustrating an abnormal contact between the conventional spring contact and an IC ball.
FIG. 6b is a plan view illustrating the abnormal contact between the conventional spring contact and the IC ball.
Figure 6:
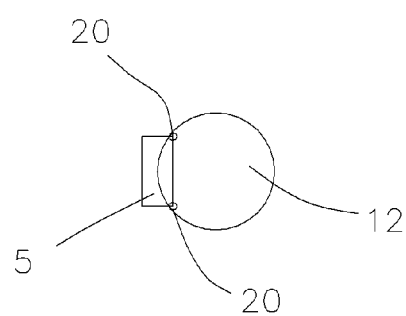

DESCRIPTION OF REFERENCE CHARACTERS
OF IMPORTANT PARTS 1, 110, 120, 130, 140, 150, 160: spring contact
10, 300: socket embedded with spring contacts
2, 13, 30, 50, 60, 170, 180: upper contact pin
4, 30, 50, 60, 70, 90, 710, 800, 810, 820, 170, 180: lower contact pin
3, 111: spring
5, 31, 51, 61, 71, 91, 711, 802, 812, 822, 171, 181, 201, 202, 203, 204, 205, 206, 207, 208: contact portion
32, 52: head
33, 53: neck
34, 64, 74, 718, 801, 811, 821: body
35, 36, 65, 66, 75, 76: spring holding protrusion
37, 714: spring holding surface
46, 716: moving groove
47, 717: stop bridge
48, 727: stop hole
38, 719: elastic portion
43, 720: moving slit
44, 725: stop surface
42, 721: locking protrusion
40, 722: oblique surface
41, 723: contact surface

BEST MODE

In order to accomplish the above-mentioned object, the present invention provides a spring contact, including:
an upper contact pin that has a predetermined body thickness t and is provided with a contact portion of a predetermined shape, a head, a neck and two spring holding protrusions that are provided in left and right sides of the contact pin so as to limit a length of an assembled spring and prevent the spring from undesirably becoming displaced, and a body;

a lower contact pin that is coupled to the upper contact pin in such a way that the upper and lower contact pins cross each other at right angles, the lower contact pin having a construction that is the same as or similar to that of the upper contact pin; and a spring that is fitted over an assembly of the upper and lower contact pins at a position between the upper and lower contact pins, wherein to increase the strength of the upper contact pin and increase the surface area of the contact portion, the head is configured to form a cylindrical shape or a square column shape or a part of the contact pin within a range from the contact portion to the spring holding protrusions is configured to have a thickness greater than the thickness of the body, thereby increasing the strength of the upper contact pin and increasing the surface area of the contact portion.

The body of each of the upper and lower contact pins includes:

two symmetric elastic portions, an end of each of which has a thickness t1 that is less than the thickness t of the body, with an oblique surface, a locking protrusion and a locking protrusion contact surface being provided in an end of each of the two symmetric elastic portions; a moving slit that is defined between the two elastic portions so as to form a moving space when the upper contact pin and the lower contact pin are assembled with each other, with a stop surface being formed on an end of the moving slit and having left and right oblique surfaces so that, when the upper contact pin is compressed against the lower contact pin with the maximum force, the stop surfaces of the two contact pins come into contact with each other and stop the compression; and moving grooves that are formed in each of the lower and upper contact pins so that the locking protrusions of the upper and lower contact pins can be moved along and stopped by the moving grooves and the locking protrusion contact surfaces of the upper and lower contact pins can be brought into electric contact with the moving grooves, the moving grooves being formed on upper and lower surfaces of each of the lower and upper contact pins, in which first ends of the moving grooves of each of the upper and lower contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced.

Hereinafter, preferred embodiments of the present invention will be described in detail with reference to the accompanying drawings.

The terminology and words used in the description and the claims of the present invention should not be interpreted as being limited merely to their common and dictionary meanings. On the contrary, they should be interpreted based on the meanings and concepts of the invention in keeping with the scope of the invention based on the principle that the inventor(s) can appropriately define the terms in order to describe the invention in the most appropriate way.

It is to be understood that the form of my invention shown and described herein is to be taken as a preferred embodiment of the present invention and that various changes and modifications may be made to the invention without departing from the spirit and scope thereof.

Figure 7A:
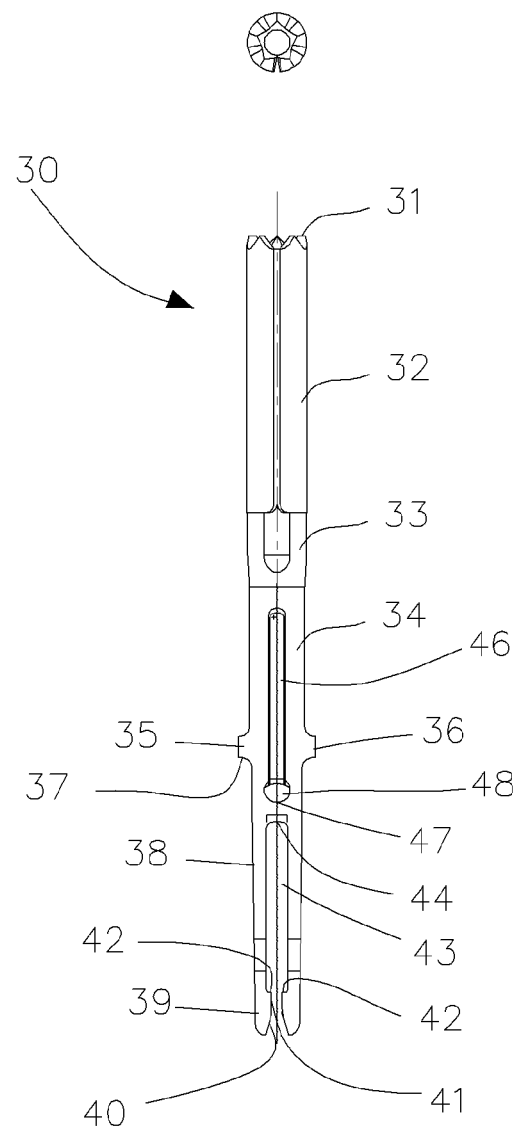
FIGS. 7a, 7b and 7c are views illustrating the structure of a contact pin of each of first, second and fifth spring contacts according to the present invention, respectively.
Figure 7B:
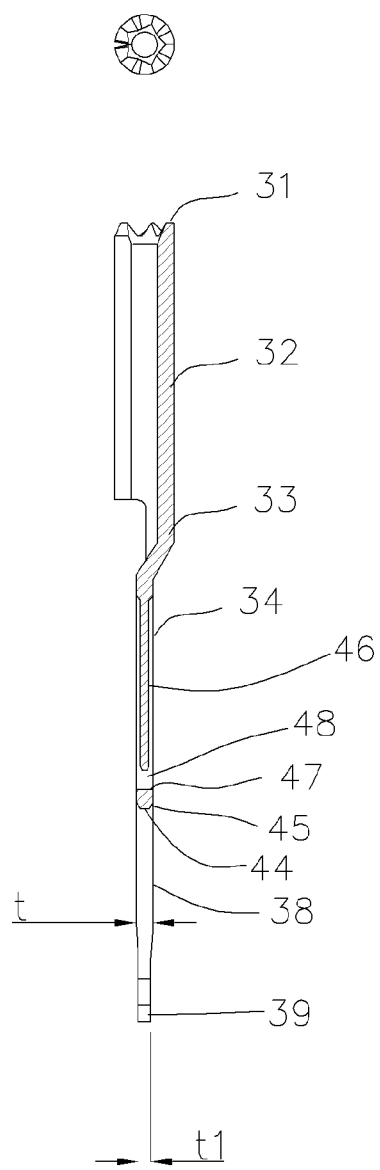
Figure 7C:
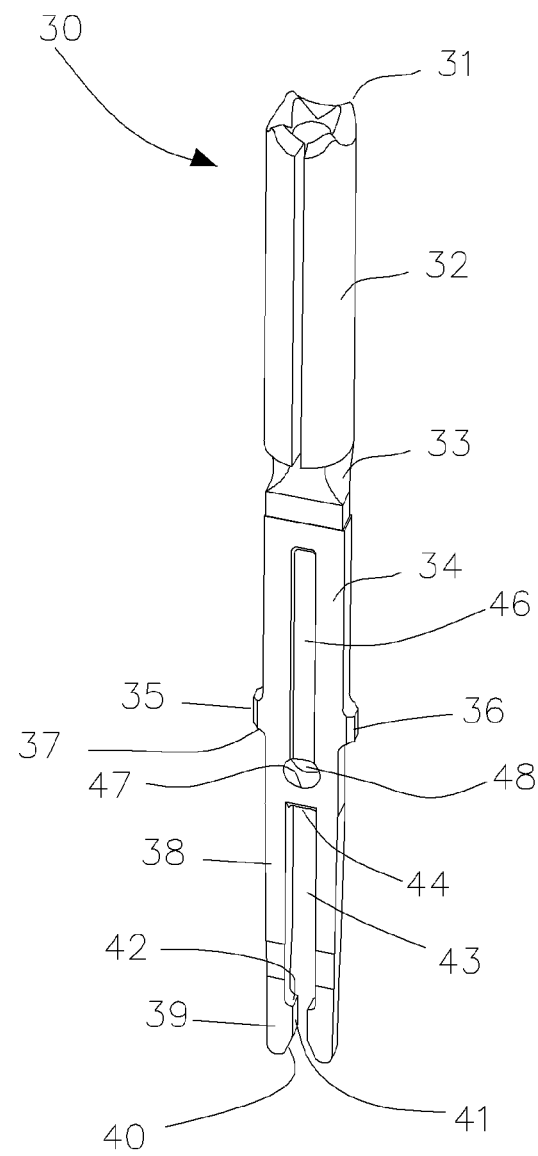

FIGS. 7a through 7c illustrate the structures of upper and lower contact pins of a first spring contact according to the present invention and the structures of upper contact pins of second and fifth spring contacts.

The contact pin 30 includes: a contact portion 31 that has four or five contact protrusions formed around an edge of a circular end of the contact pin; a head 32 that is bent and has a cylindrical shape; a neck 33 that connects the head 32 and a body 34 of the contact pin to each other; the body 34; two spring holding protrusions 35 and 36 that are provided in left and right sides of the body so as to limit a length of an assembled spring 111; two elastic portions 38 that are provided at locations below the body, an end 39 of each of which has a thickness t1 that is less than the thickness t of the body 34, with oblique surfaces 40, locking protrusions 42 and locking protrusion contact surfaces 41 being symmetrically formed in respective ends of the two symmetric elastic portions; a moving slit 43 that is defined between the two elastic portions 38 so as to form a moving space, with a stop surface 44 being formed on an end of the moving slit; and moving grooves 46 that are formed in the body of each of the lower and upper contact pins at locations above the moving slit, the moving grooves being formed on upper and lower surfaces of the body, in which first ends of the moving grooves have a stop hole 48 that forms a stop bridge 47, and second ends extend in a direction toward the contact portion after passing through spring holding surfaces 37 of the two spring holding protrusions that function to limit the length of the assembled spring 111 and to prevent the spring from undesirably becoming displaced.

Figure 8:
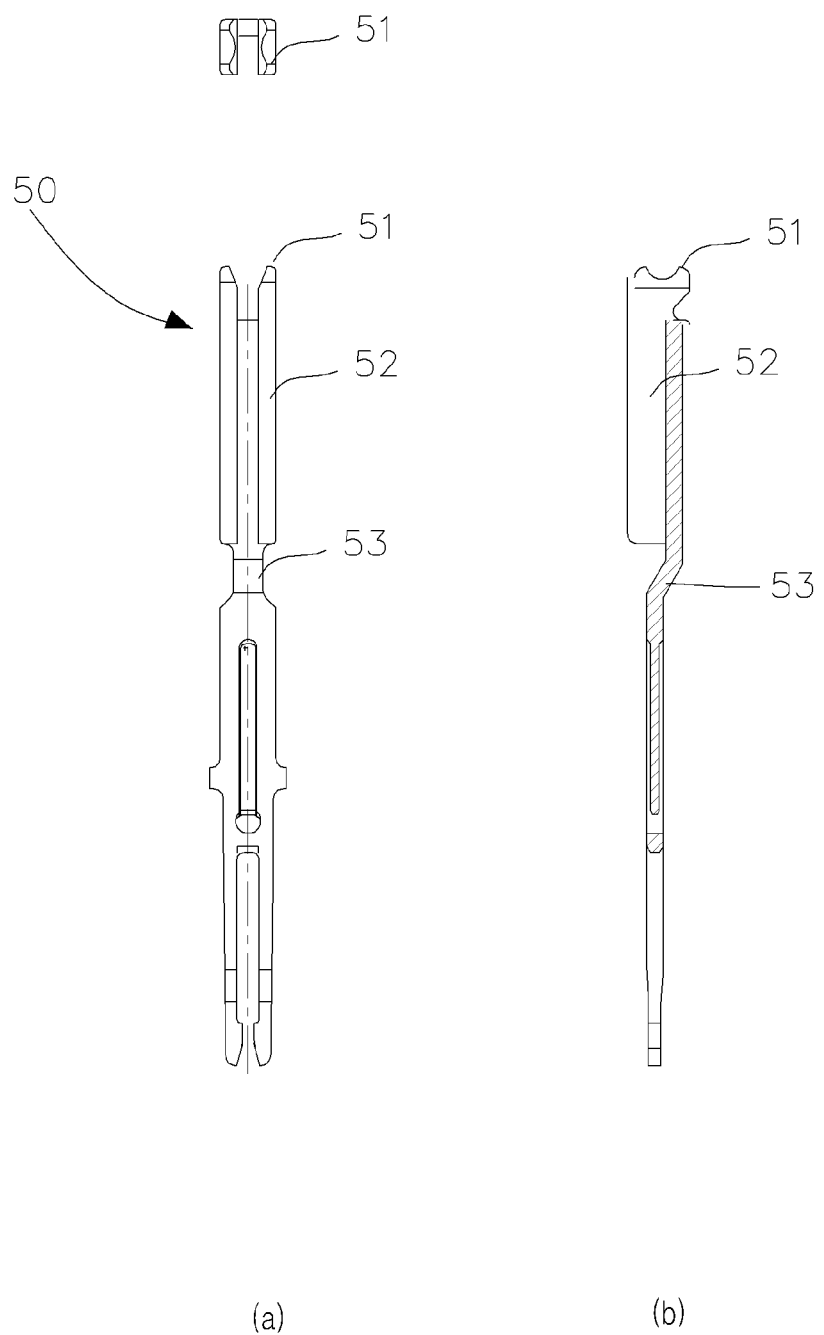
FIG. 8 illustrates the structure of a contact pin having an altered shape of each of the first, second and fifth spring contacts according to the present invention.

In the contact pin 50 shown in FIGS. 8a and 8b, the head is configured to form a ⊂-shaped cross section or a ∪-shaped cross section, thereby having a structure capable of increasing the strength of the head compared to a flat plate-shaped head. The head of the contact pin 50 is characterized in that the contact portion formed in the end of the head is provided with four contact protrusions.

Figure 9:
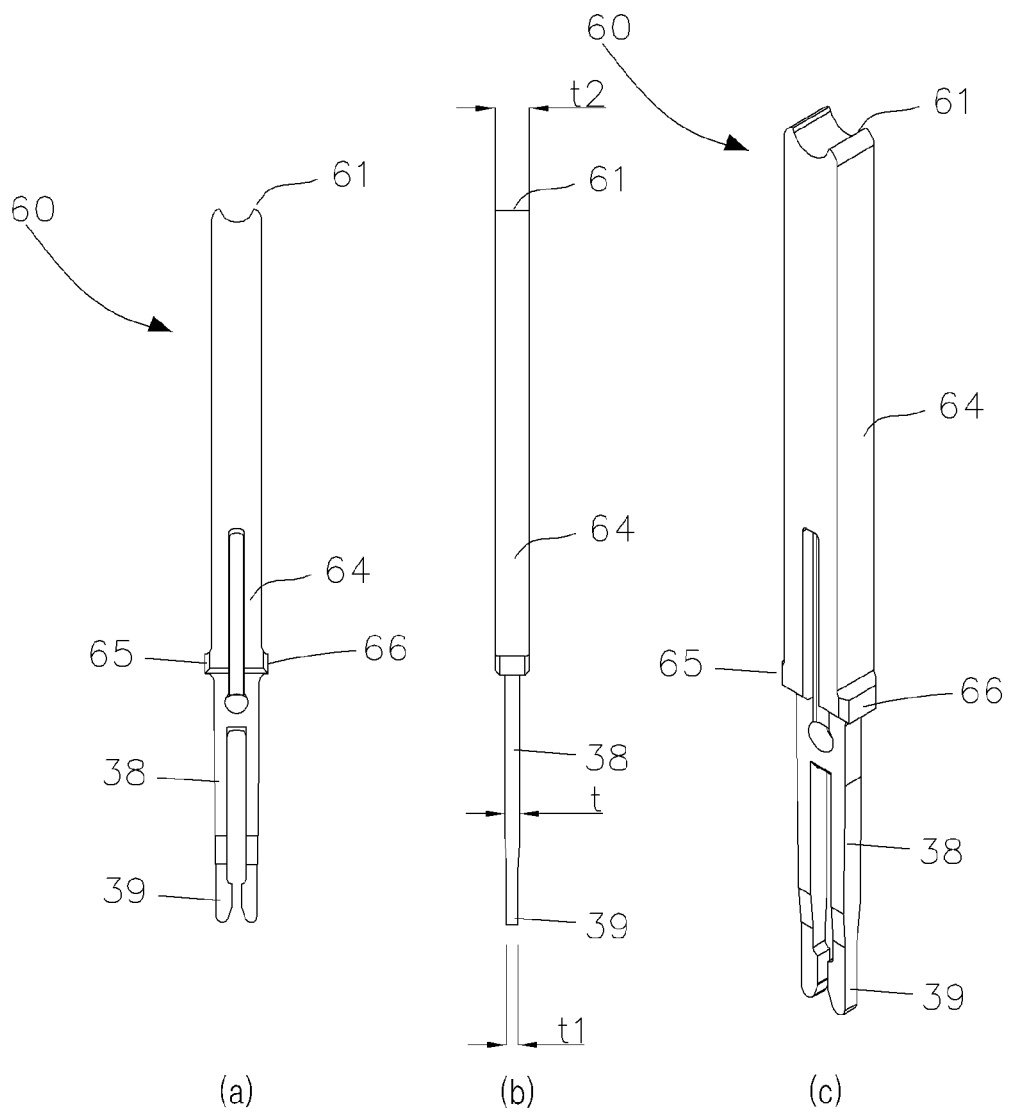
FIG. 9 illustrates the structure of a contact pin of each of third, fourth and sixth spring contacts according to the present invention.

FIGS. 9a, 9b and 9c illustrate structures of the upper and lower contact pins of a third spring contact, and the upper contact pins of fourth and sixth spring contacts according to the present invention.

Here, please note that some of the reference numerals designating the same parts and the same indexes as are shown in the following description may be omitted from some of the accompanying drawings.

The contact pin 60 includes a contact portion 61 of a predetermined shape, a body 64, two spring holding protrusions 65 and 66 that are provided in left and right sides of the body 64 so as to limit a length of an assembled spring, and two elastic portions 38 that are provided below the body. Particularly, in the contact pin 60, the thickness t2 of each of the contact portion, the body and the two spring holding protrusions 65 and 66 that are provided in the left and right sides of the body so as to limit the length of the assembled spring 111 is greater than the thickness t of each of the two elastic portions.

An end 39 of each of the two elastic portions has a thickness t1 that is less than the thickness t of the body 64, with oblique surfaces 40, locking protrusions 42 and locking protrusion contact surfaces 41 being symmetrically formed in respective ends of the two symmetric elastic portions. A moving slit 43 is defined between the two elastic portions 38 so as to form a moving space, with a stop surface 44 being formed on an end of the moving slit. Moving grooves 46 are formed in the body of the contact pin at locations above the moving slit. The moving grooves 46 are formed on upper and lower surfaces of the body, in which first ends of the moving grooves have a stop hole 48 that forms a stop bridge 47, and second ends extend in a direction toward the contact portion after passing through the spring holding surfaces 37 of the two spring holding protrusions that function to limit the length of the assembled spring 111 and to prevent the spring from undesirably becoming displaced.

Figure 10:
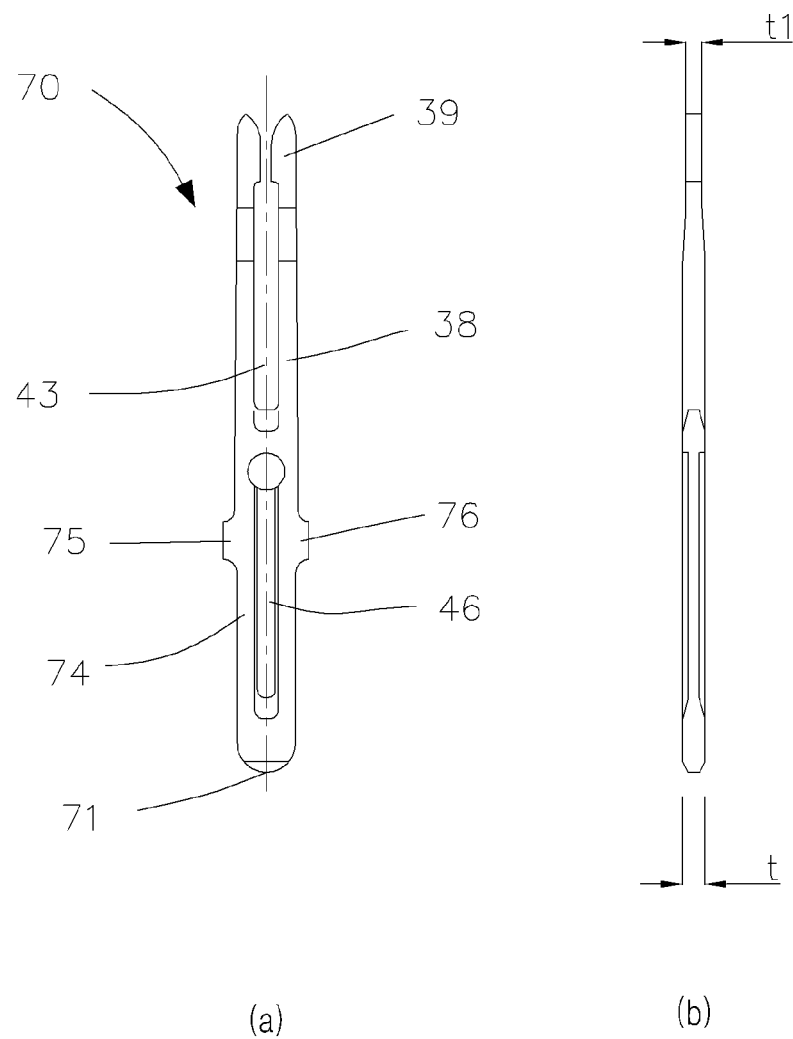
FIGS. 10 and 11 are views illustrating the structures of lower contact pins of the second and fourth spring contacts according to the present invention, respectively.
Figure 11:
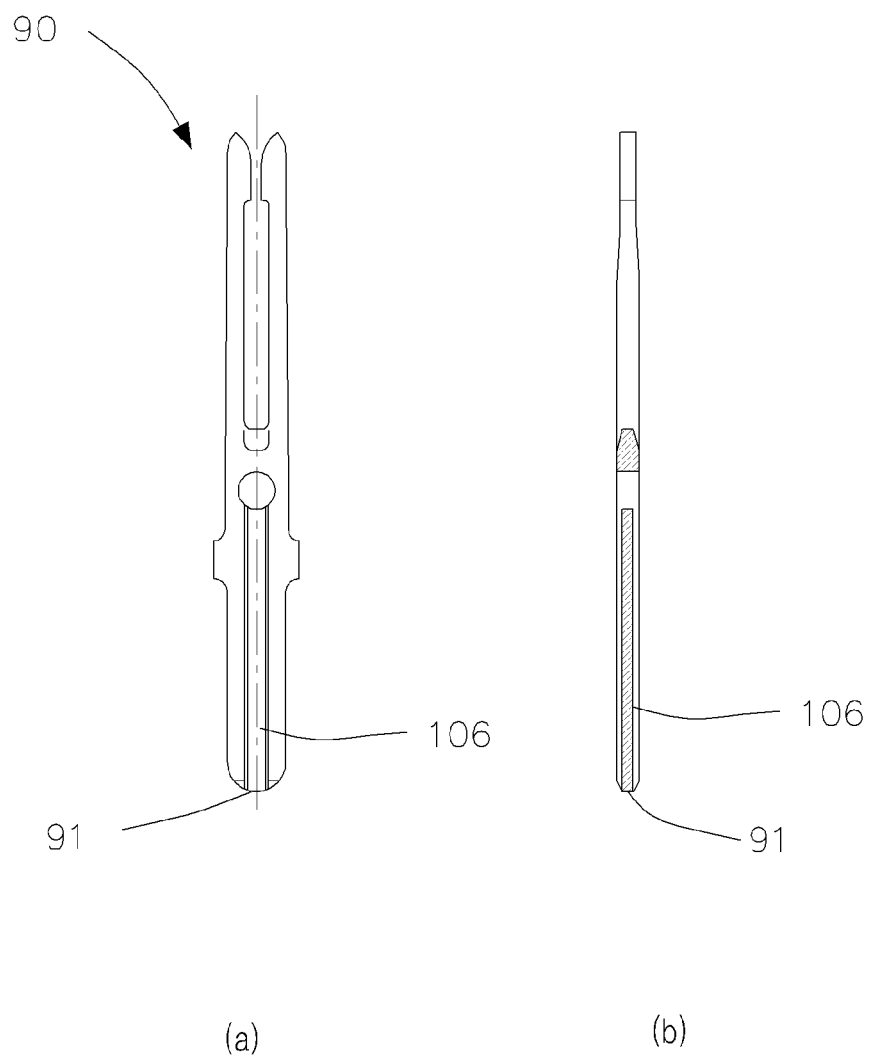

FIGS. 10 and 11 illustrate the structures of the lower contact pins of the second and fourth spring contacts according to the present invention, respectively.

The contact pin 70 includes a contact portion 71 of a predetermined shape, a body 74, two spring holding protrusions 75 and 76 that are provided in left and right sides of the body 74 so as to limit the length of an assembled spring, and two elastic portions 38 that are provided below the body. An end 39 of each of the two elastic portions has a thickness t1 that is less than the thickness t of the body of each elastic portion 38, with oblique surfaces 40, locking protrusions 42 and locking protrusion contact surfaces 41 being symmetrically formed in respective ends of the two symmetric elastic portions. A moving slit 43 is defined between the two elastic portions 38 so as to form a moving space, with a stop surface 44 being formed on an end of the moving slit. Moving grooves 46 are formed in the body of the contact pin at locations below the moving slit. The moving grooves 46 are formed on upper and lower surfaces of the body, in which first ends of the moving grooves have a stop hole 48 that forms a stop bridge 47, and second ends extend in a direction toward the contact portion 71 after passing through the spring holding surfaces 37 of the two spring holding protrusions that function to limit the length of the assembled spring 111 and to prevent the spring from undesirably becoming displaced.

In the lower contact pin 90 that is shown in FIGS. 11a and 11b, the moving grooves 106 are formed on upper and lower surfaces of the body, in which first ends of the moving grooves have a stop hole 48 that forms a stop bridge 47, and second ends extend to the end of the contact portion 91 after passing through the spring holding surfaces 37 of the two spring holding protrusions that function to limit the length of the assembled spring 111 and to prevent the spring from undesirably becoming displaced.

Figure 12:
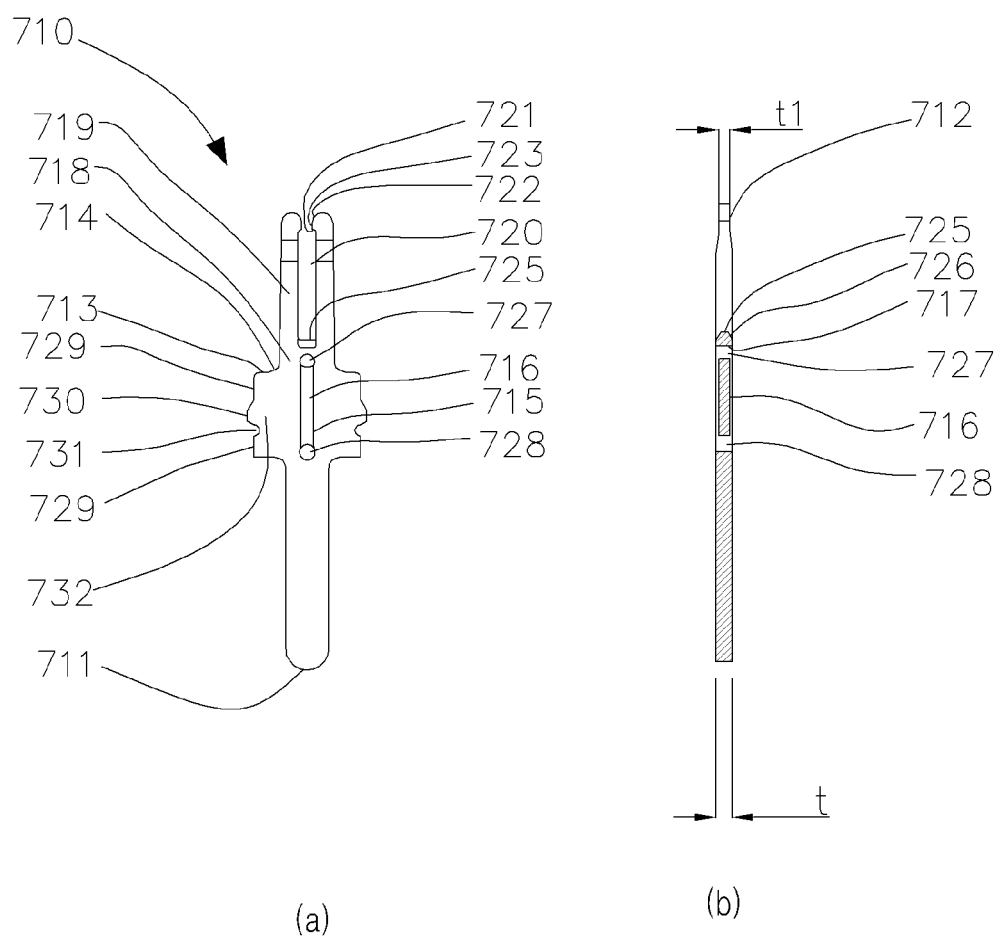
FIGS. 12 to 15 are views illustrating a variety of structures of lower contact pins of the fifth and sixth spring contacts according to the present invention.

FIG. 12 illustrates the structure of a lower contact pin of each of the fifth and sixth spring contacts according to the present invention.

The contact pin 710 includes a long contact portion 711 that has a substantial length suitable for soldering, a body 718, two spring holding surfaces 714 that are provided on left and right sides of the body 718 so as to limit a length of an assembled spring 111, and two elastic portions 719 that are provided above the body. An end 712 of each of the two elastic portions has a thickness t1 that is less than the thickness t of the body 718, with oblique surfaces 722, locking protrusions 721 and locking protrusion contact surfaces 723 being symmetrically formed in respective ends of the two symmetric elastic portions. A moving slit 43 is defined between the two elastic portions 38 so as to form a moving space, with a stop surface 44 being formed on an end of the moving slit. Moving grooves 46 are formed in the body of the contact pin at locations below the moving slit. The moving grooves 46 are formed on upper and lower surfaces of the body, in which first ends of the moving grooves have a stop hole 48 that forms a stop bridge 47, and second ends extend in a direction toward the contact portion 711 after passing through the spring holding surfaces 37 of the two spring holding protrusions that function to limit the length of the assembled spring 111 and to prevent the spring from undesirably becoming displaced.

Particularly, in the lower contact pin 710, each of the two spring holding surfaces 714 further extends so as to form a pin fitting part 732, which has an assembly stop surface 713 and functions to hold the lower contact pin fitted in a molded socket body. A fitting protrusion 730 is provided on an end 729 of the pin fitting part 732 so as to prevent the lower contact pin from being removed from the molded socket body after fitting the lower contact pin into the molded socket body. Here, the contact portion 711 of the lower contact pin 710 is soldered to a PCB.

Figure 13:
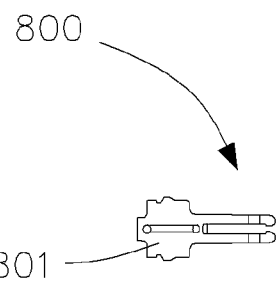
Figure 13:
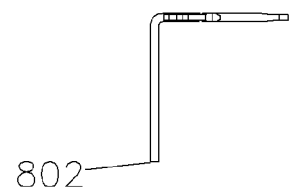
Figure 14:
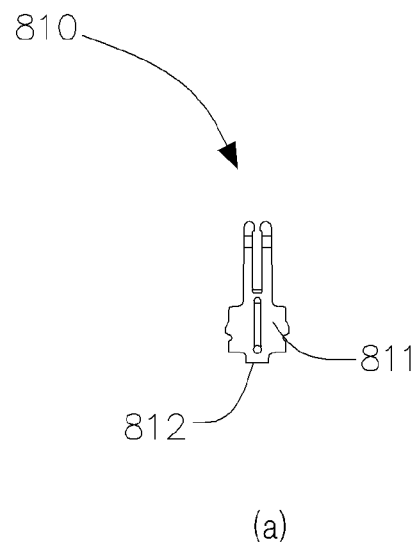
Figure 14:
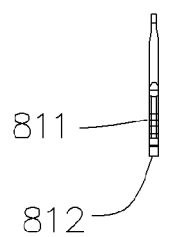
Figure 15:
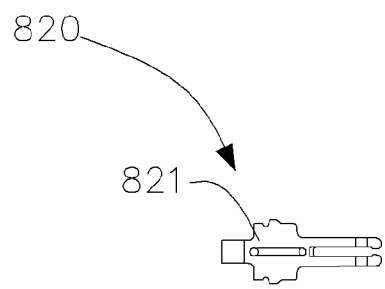
Figure 15:

FIGS. 13 to 15 illustrate modified structures of the lower contact pins of the fifth and sixth spring contacts according to the present invention.

FIGS. 13a and 13b illustrate a lower contact pin 800, the contact portion of which is bent at an angle of 90 degrees and is configured into a contact portion that can be soldered to a PCB by an angle type thru-hole soldering.

FIGS. 14a and 14b illustrate a lower contact pin 810, the contact portion of which is configured into a short straight contact portion that can be vertically surface-mounted to a PCB by SMT soldering.

FIGS. 15a and 15b illustrate a lower contact pin 820, the contact portion of which is bent twice at an angle of 90 degrees so as to form an S-shaped appearance and is configured into a contact portion that can be surface-mounted to a PCB by an angle type SMT soldering.

Figure 16:
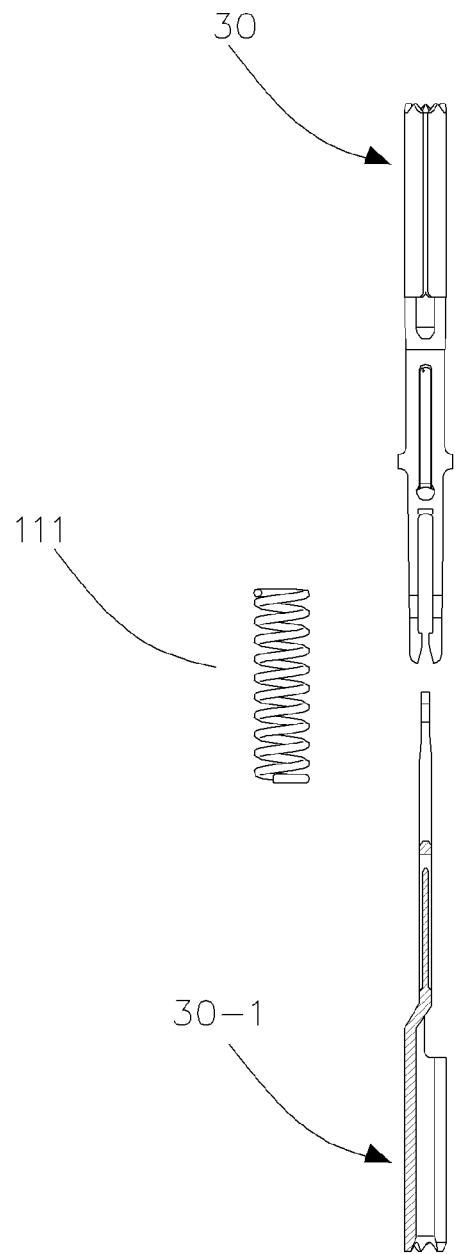
FIG. 16 is a development view illustrating the structure of the first spring contact according to the present invention.

FIG. 16 is a development view illustrating the upper contact pin 30, the lower contact pin 30 and the spring 111 of the first spring contact according to the present invention.

Figure 17:
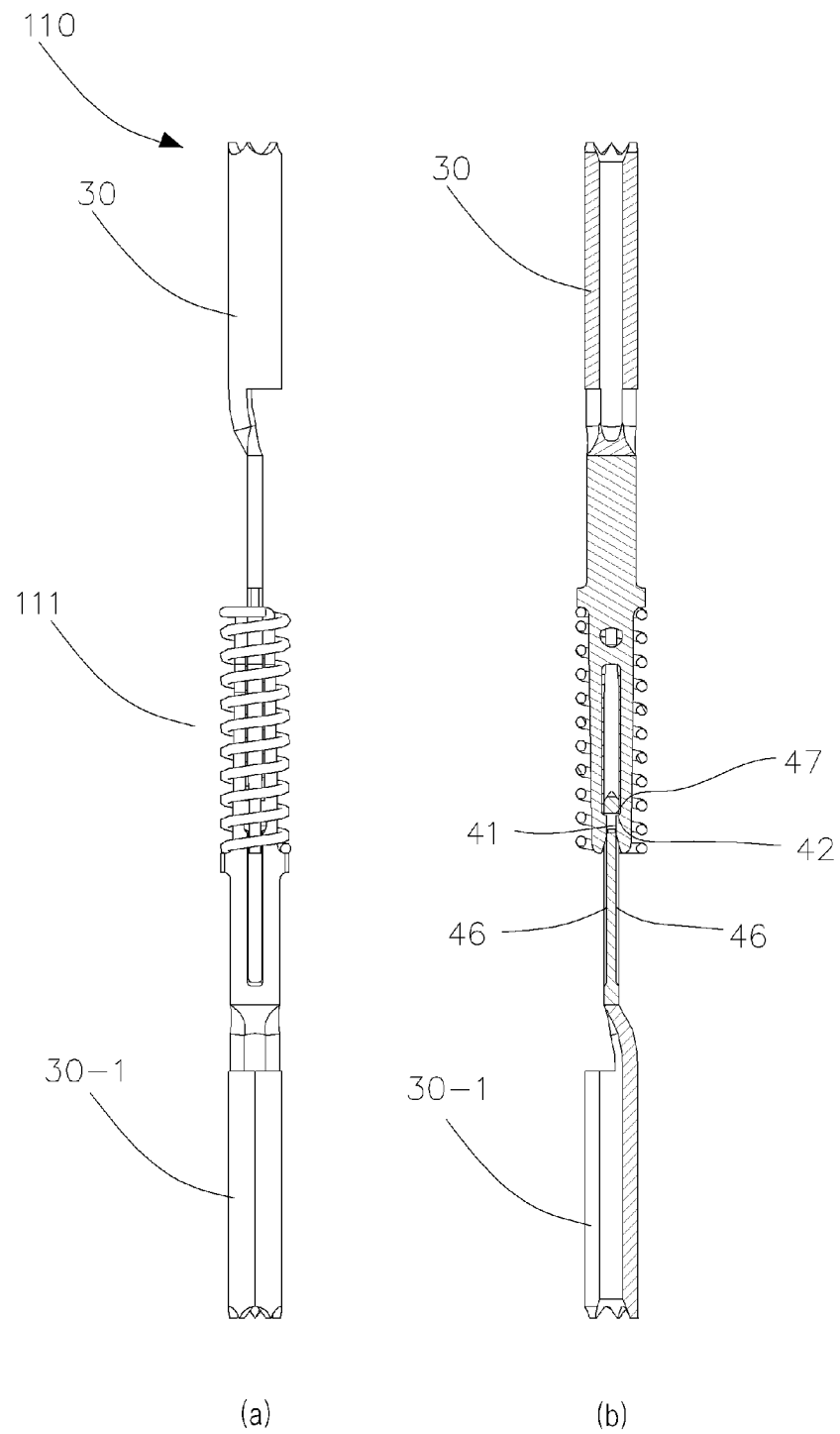
FIG. 17 illustrates the structure of the first spring contact according to the present invention in a front view and a sectional view.

FIG. 17 illustrates the assembly of the upper contact pin 30, the lower contact pin 30-1 and the spring 111 of the first spring contact 110 according to the present invention in a front view and a sectional view.

Figure 18:
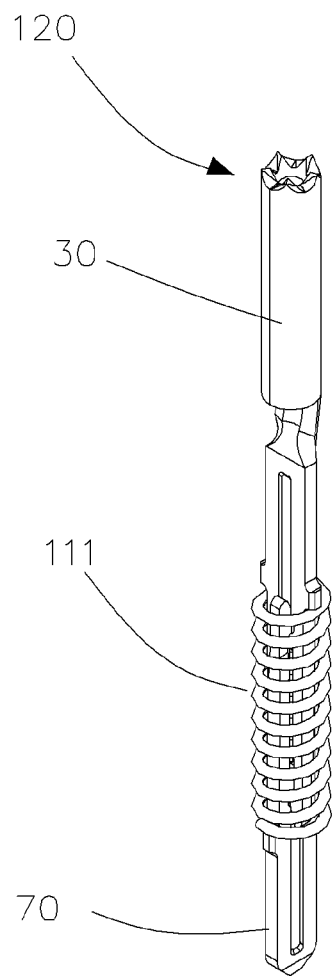
FIG. 18 is a perspective view illustrating the second spring contact according to the present invention.

FIG. 18 is a perspective view illustrating the assembly of the upper contact pin 30, the lower contact pin 70 and the spring 111 of the second spring contact 120 according to the present invention.

Figure 19:
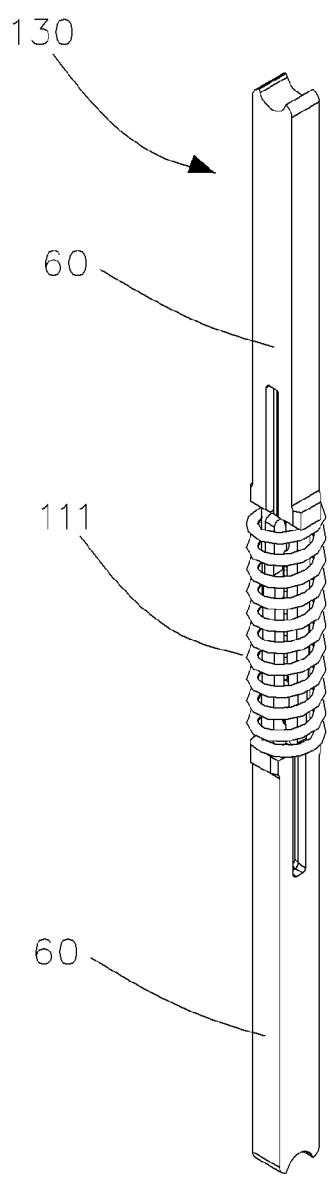
FIG. 19 is a perspective view illustrating the third spring contact according to the present invention.

FIG. 19 is a perspective view illustrating the assembly of the upper contact pin 60, the lower contact pin 60 and the spring 111 of the third spring contact 130 according to the present invention.

Figure 20:
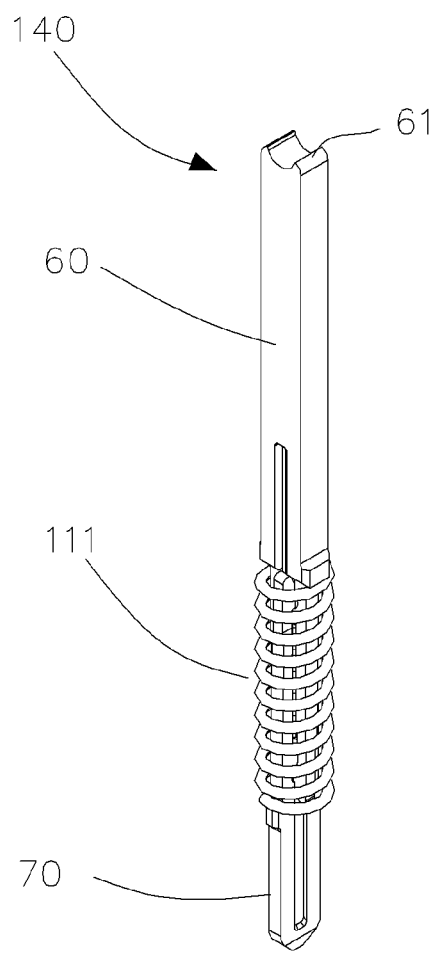
FIG. 20 is a perspective view illustrating the fourth spring contact according to the present invention.

FIG. 20 is a perspective view illustrating the assembly of the upper contact pin 60, the lower contact pin 70 and the spring 111 of the fourth spring contact 140 according to the present invention.

Figure 21:
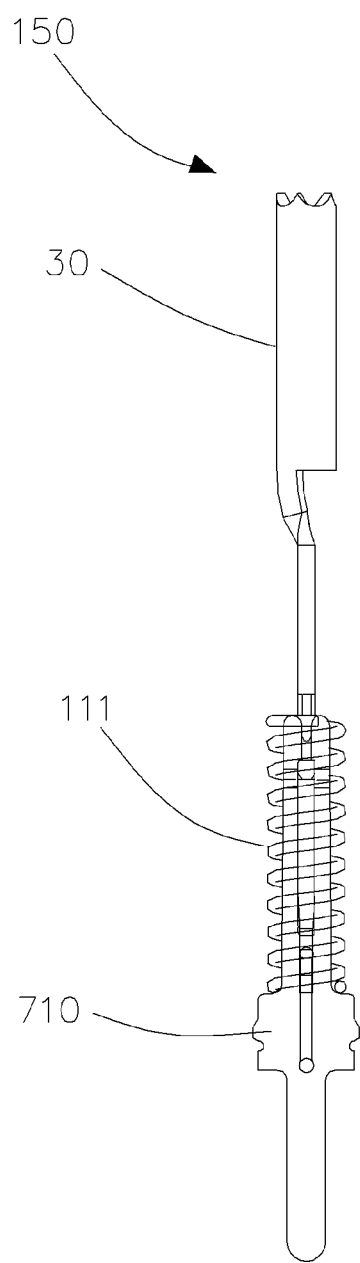
FIG. 21 is a view illustrating the fifth spring contact according to the present invention.

FIG. 21 is a perspective view illustrating the assembly of the upper contact pin 30, the lower contact pin 710 and the spring 111 of the fifth spring contact 150 according to the present invention.

Figure 22:
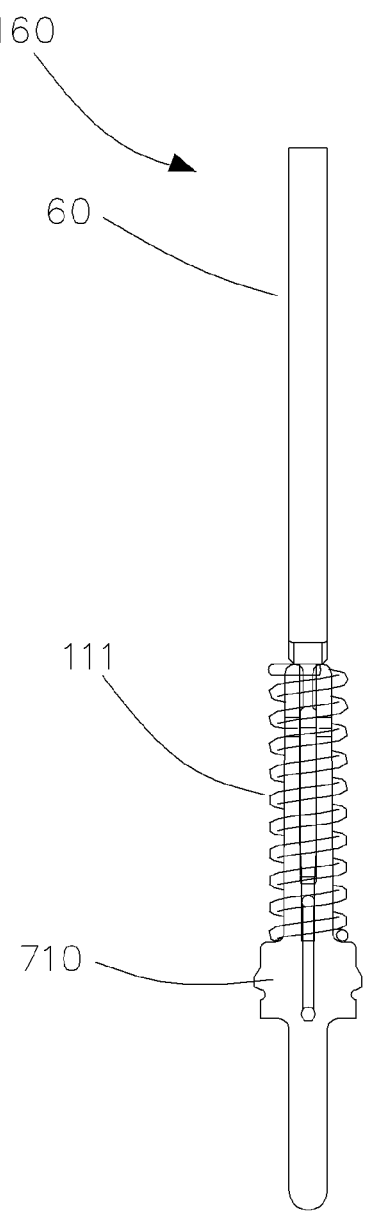
FIG. 22 is a view illustrating the sixth spring contact according to the present invention.

FIG. 22 is a perspective view illustrating the assembly of the upper contact pin 60, the lower contact pin 710 and the spring 111 of the sixth spring contact 160 according to the present invention.

Figure 23:
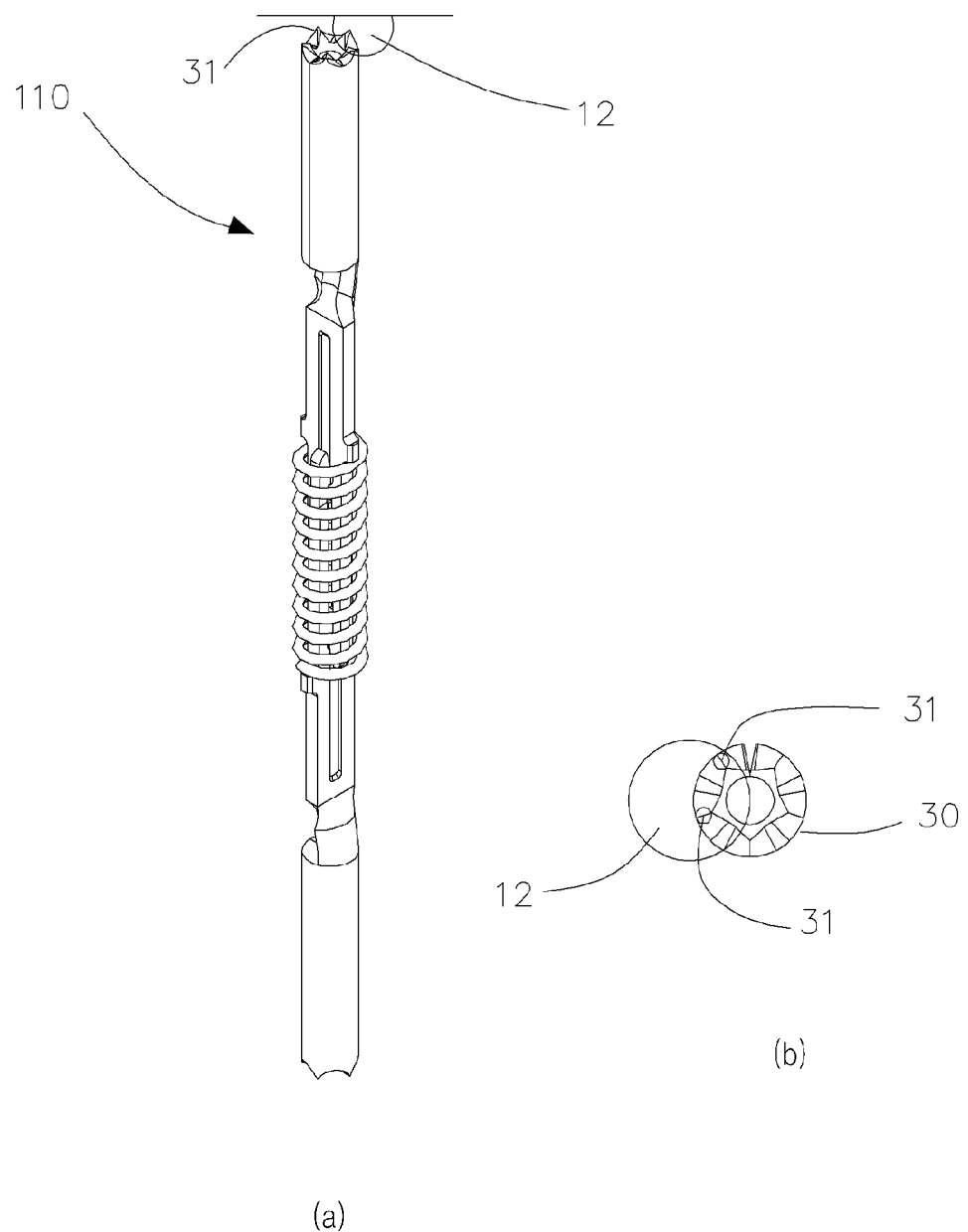
FIG. 23a is a view illustrating an abnormal contact between an IC ball and the first spring contact according to the present invention.
FIG. 23b is a plan view illustrating the abnormal contact between the IC ball and the first spring contact according to the present invention.
Figure 24:
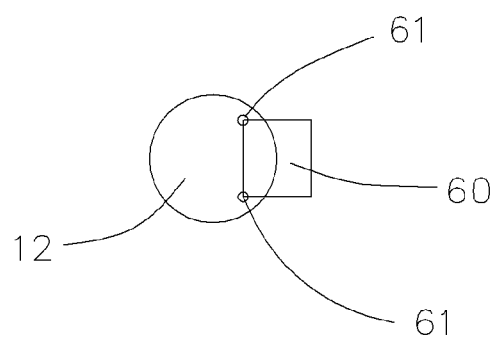
FIG. 24 is a plan view illustrating an abnormal contact between the IC ball and the third spring contact according to the present invention.

FIGS. 23a and 23b illustrate an eccentric contact state in which the five contact protrusions that are formed around the edge of the end of the cylindrical head of the upper contact pin 30 of the first spring contact 110 according to the present invention deviate from an IC ball by 0.15 mm. FIG. 24 illustrates an eccentric contact state in which the large areal contact portion 61 of the upper contact pin 60 of the third spring contact 130 according to the present invention deviates from an IC ball by 0.15 mm.

Figure 25:
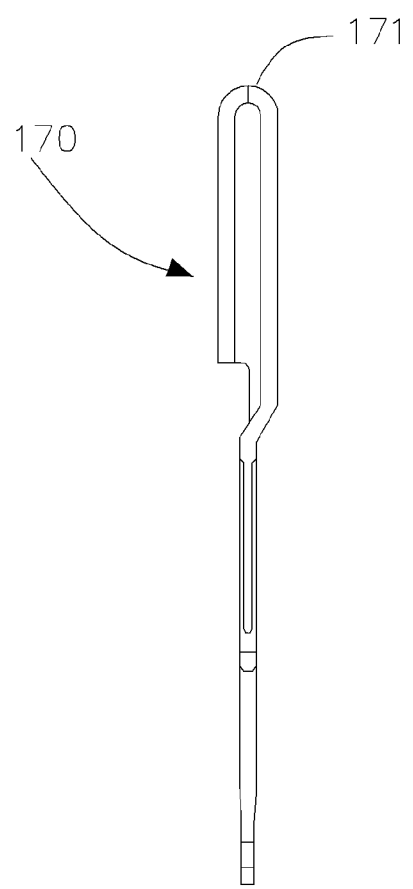
FIGS. 25 and 26 are views illustrating different shapes of the contact portions of the contact pins of the first, second and fifth spring contacts according to the present invention.
Figure 26:
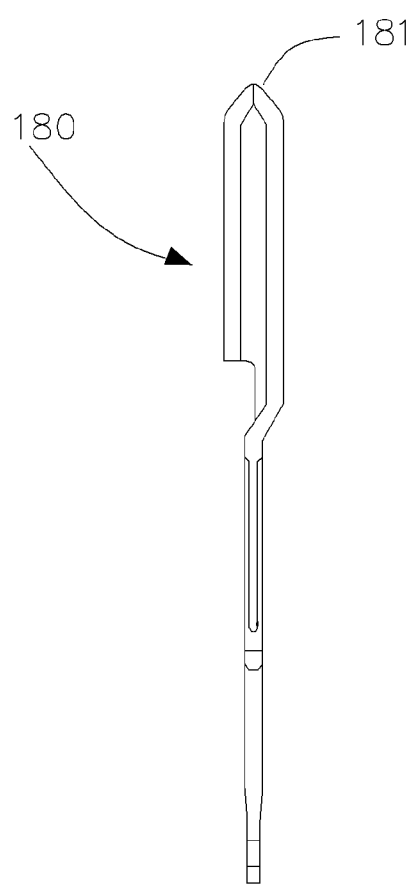
Figure 27:
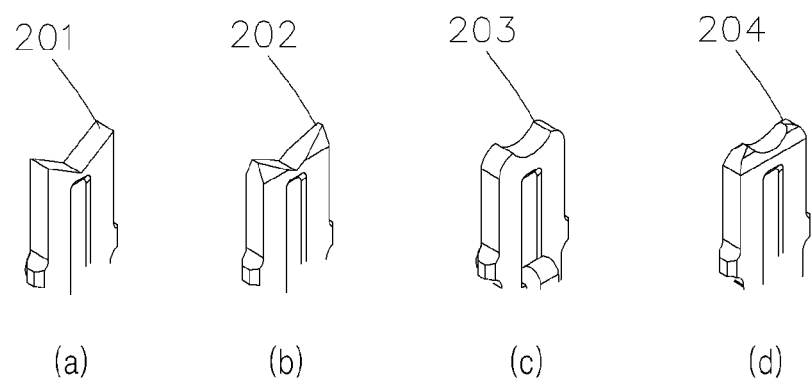
FIG. 27 is a view illustrating a variety of shapes of the contact portions of the contact pins of the second, third, fourth and sixth spring contacts according to the present invention.
Figure 27:
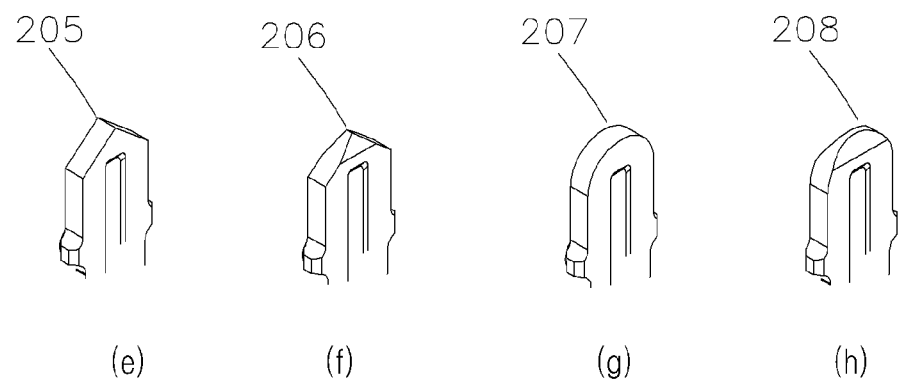

FIGS. 25 and 26 illustrate embodiments in which the contact portion, which is formed by the end of the cylindrical head of each of the upper and lower contact pins 30 and 30-1 of the first spring contact 110 and the upper contact pin 30 of the fifth spring contact 150 according to the present invention, is configured into a hemispherical contact portion, a circular conical contact portion and a pyramidal contact portion.

Further, the head of FIGS. 8a and 8b may be configured into a square column head or a polygonal column head and the contact portion that is provided on the end of the head may be provided with a plurality of contact protrusions or may be configured into a pyramidal contact portion.

FIGS. 27a to 27h illustrate a variety of shapes of the contact portions 201, 202, 203, 204, 205, 206, 207 and 208 of the lower contact pin 70 of the second spring contact 120 according to the present invention, the upper and lower contact pins 60 of the third spring contact 130 according to the present invention and the upper and lower contact pins 60 and 70 of the fourth spring contact 140 according to the present invention, which can be selected from a V-shape, a chamfered V-shape, a U-shape, a chamfered U-shape, an A-shape, a chamfered A-shape, a round shape and a chamfered round shape.

Figure 28:
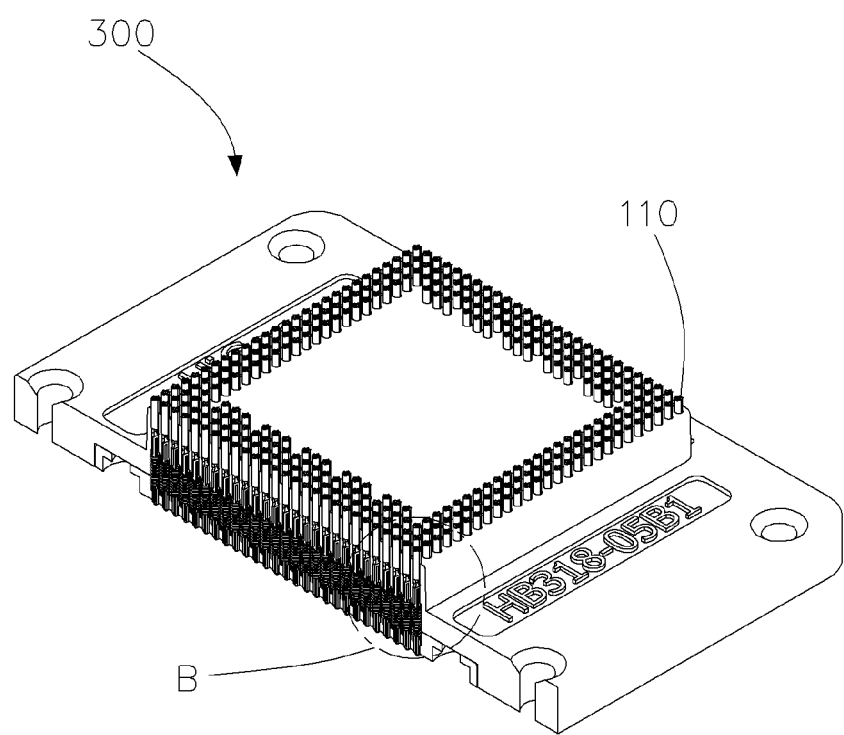
FIG. 28 is a view illustrating the construction of a socket embedded with the second spring contacts according to the present invention.
Figure 29:
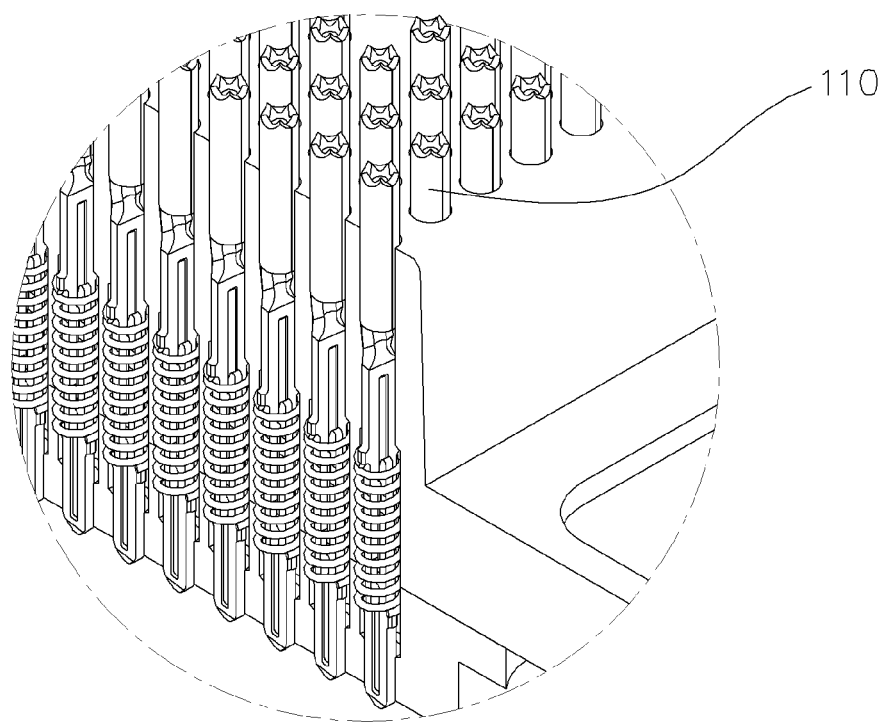
FIG. 29 is a view illustrating the construction of portion B of FIG. 28.

FIG. 28 illustrates a socket embedded with the second spring contacts according to the present invention and FIG. 29 is a view illustrating portion B of FIG. 28 in detail.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A spring contact having an upper contact pin, a lower contact pin and a spring, comprising:
    an upper contact pin including: a contact portion of a predetermined shape, a head, a neck, a body, two spring holding protrusions that are provided in left and right sides of the body so as to limit a length of an assembled spring, and two elastic portions that are provided at locations below the body;
    a lower contact pin that is coupled to the upper contact pin in such a way that the upper and lower contact pins cross each other at right angles, the lower contact pin including: a contact portion of a predetermined shape, a head, a neck, a body, two spring holding protrusions that are provided in left and right sides of the body so as to limit the length of the assembled spring, and two elastic portions; and
    the spring fitted over an assembly of the lower contact pin and the upper contact pin at a position between the two contact pins, wherein
    an end of each of the two elastic portions of the upper contact pin and the lower contact pin has a thickness (t1) that is less than a thickness (t) of the body, with oblique surfaces, locking protrusions and locking protrusion contact surfaces being symmetrically formed in respective ends of the two elastic portions; a moving slit is defined between the two elastic portions so as to form a moving space when the upper contact pin and the lower contact pin are coupled to each other while crossing at right angles, with a stop surface being formed on an end of the moving slit so that, when the upper contact pin is compressed against the lower contact pin with a maximum force, the stop surfaces of the two contact pins come into contact with each other and stop the compression; and moving grooves are formed in the body of each of the lower and upper contact pins so that the locking protrusions of the lower and upper contact pins can be moved along and stopped by the moving grooves and the locking protrusion contact surfaces of the lower and upper contact pins can be brought into electric contact with the moving grooves, the moving grooves being formed on upper and lower surfaces of each of the lower and upper contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced.

2. A spring contact having an upper contact pin, a lower contact pin and a spring, comprising:
    an upper contact pin including: a contact portion of a predetermined shape, a head, a neck, a body, two spring holding protrusions that are provided in left and right sides of the body so as to limit a length of an assembled spring, and two elastic portions that are provided at locations below the body;
    a lower contact pin that is coupled to the upper contact pin in such a way that the upper and lower contact pins cross each other at right angles, the lower contact pin including: a contact portion of a predetermined shape, a body, two spring holding protrusions that are provided in left and right sides of the body so as to limit the length of the assembled spring, and two elastic portions; and
    the spring fitted over an assembly of the lower contact pin and the upper contact pin at a position between the two contact pins, wherein
    an end of each of the two elastic portions of the upper contact pin and the lower contact pin has a thickness (t1) that is less than a thickness (t) of the body, with oblique surfaces, locking protrusions and locking protrusion contact surfaces being symmetrically formed in respective ends of the two elastic portions; a moving slit is defined between the two elastic portions so as to form a moving space when the upper contact pin and the lower contact pin are coupled to each other while crossing at right angles, with a stop surface being formed on an end of the moving slit so that when the upper contact pin is compressed against the lower contact pin with a maximum force, the stop surfaces of the two contact pins come into contact with each other and stop the compression; and moving grooves are formed in the body of each of the lower and upper contact pins so that the locking protrusions of the lower and upper contact pins can be moved along and stopped by the moving grooves and the locking protrusion contact surfaces of the lower and upper contact pins can be brought into electric contact with the moving grooves, the moving grooves being formed on upper and lower surfaces of each of the lower and upper contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced.

3. A spring contact having an upper contact pin, a lower contact pin and a spring, comprising:
    an upper contact pin including: a contact portion of a predetermined shape, a body, two spring holding protrusions that are provided in left and right sides of the body so as to limit a length of an assembled spring, and two elastic portions that are provided at locations below the body;
    a lower contact pin that is coupled to the upper contact pin in such a way that the upper and lower contact pins cross each other at right angles, the lower contact pin including: a contact portion of a predetermined shape, a body, two spring holding protrusions that are provided in left and right sides of the body so as to limit the length of the assembled spring, and two elastic portions; and the spring fitted over an assembly of the lower contact pin and the upper contact pin at a position between the two contact pins, wherein a thickness (t2) of each of the contact portion, the body and the two spring holding protrusions that are provided in the left and right sides of the body of each of the upper and lower contact pins so as to limit the length of the assembled spring is greater than a thickness (t) of each of the two elastic portions, wherein an end of each of the two elastic portions of the upper contact pin and the lower contact pin has a thickness (t1) that is less than the thickness (t) of the elastic portion, with oblique surfaces, locking protrusions and locking protrusion contact surfaces being symmetrically formed in respective ends of the two elastic portions; a moving slit is defined between the two elastic portions so as to form a moving space when the upper contact pin and the lower contact pin are coupled to each other while crossing at right angles, with a stop surface being formed on an end of the moving slit so that when the upper contact pin is compressed against the lower contact pin with a maximum force, the stop surfaces of the two contact pins come into contact with each other and stop the compression; and moving grooves are formed in the body of each of the lower and upper contact pins so that the locking protrusions of the lower and upper contact pins can be moved along and stopped by the moving grooves and the locking protrusion contact surfaces (41) of the lower and upper contact pins can be brought into electric contact with the moving grooves, the moving grooves being formed on upper and lower surfaces of each of the lower and upper contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced.

4. A spring contact having an upper contact pin, a lower contact pin and a spring, comprising:

an upper contact pin including: a contact portion of a predetermined shape, a body, two spring holding protrusions that are provided in left and right sides of the body so as to limit a length of an assembled spring, and two elastic portions that are provided at locations below the body;

a lower contact pin that is coupled to the upper contact pin in such a way that the upper and lower contact pins cross each other at right angles, the lower contact pin including: a contact portion of a predetermined shape, a body, two spring holding protrusions that are provided in left and right sides of the body so as to limit the length of the assembled spring, and two elastic portions; and the spring fitted over an assembly of the lower contact pin and the upper contact pin at a position between the two contact pins, wherein a thickness (t2) of each of the contact portion, the body and the two spring holding protrusions that are provided in the left and right sides of the body of the upper contact pin so as to limit the length of the assembled spring is greater than a thickness (t) of each of the two elastic portions, wherein an end of each of the two elastic portions of the upper contact pin and the lower contact pin has a thickness (t1) that is less than the thickness (t) of the elastic portion, with oblique surfaces, locking protrusions and locking protrusion contact surfaces being symmetrically formed in respective ends of the two elastic portions; a moving slit is defined between the two elastic portions so as to form a moving space when the upper contact pin and the lower contact pin are coupled to each other while crossing at right angles, with a stop surface being formed on an end of the moving slit so that when the upper contact pin is compressed against the lower contact pin with a maximum force, the stop surfaces of the two contact pins come into contact with each other and stop the compression; and moving grooves are formed in the body of each of the lower and upper contact pins so that the locking protrusions of the lower and upper contact pins can be moved along and stopped by the moving grooves and the locking protrusion contact surfaces of the lower and upper contact pins can be brought into electric contact with the moving grooves, the moving grooves being formed on upper and lower surfaces of each of the lower and upper contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced.

5. A spring contact having an upper contact pin, a lower contact pin and a spring, comprising:

an upper contact pin including: a contact portion of a predetermined shape, a head, a neck, a body, two spring holding protrusions that are provided in left and right sides of the body so as to limit a length of an assembled spring, and two elastic portions that are provided at locations below the body;

a lower contact pin that is coupled to the upper contact pin in such a way that the upper and lower contact pins cross each other at right angles, the lower contact pin including: a contact portion of a predetermined shape, a body, two spring holding surfaces that are provided in left and right sides of the body so as to limit the length of the assembled spring, and two elastic portions; and the spring fitted over an assembly of the lower contact pin and the upper contact pin at a position between the two contact pins, wherein each of ends of each of the two elastic portions of the upper contact pin and the lower contact pin has a thickness (t1) that is less than a thickness (t) of the body, with oblique surfaces, locking protrusions and locking protrusion contact surfaces being symmetrically formed in respective ends of the two elastic portions; a moving slit is defined between the two elastic portions of each of the upper and lower contact pins so as to form a moving space when the upper contact pin and the lower contact pin are coupled to each other while crossing at right angles, with a stop surface being formed on an end of the moving slit so that when the upper contact pin is compressed against the lower contact pin with a maximum force, the stop surfaces of the two contact pins come into contact with each other and stop the compression; and moving grooves are formed in the body of each of the upper and lower contact pins so that the locking protrusions of the upper and lower contact pins can be moved along and stopped by the moving grooves and the locking protrusion contact surfaces of the upper and lower contact pins can be brought into electric contact with the moving grooves, the moving grooves being formed on upper and lower surfaces of each of the upper and lower contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced, wherein each of the two spring holding surfaces of the lower contact pin further extends so as to form a pin fitting part that has an assembly stop surface so as to hold the lower contact pin fitted in a molded body of a socket, with a fitting protrusion provided on an end of the pin fitting part so as to prevent the lower contact pin from being removed from the molded body of the socket after fitting the lower contact pin into the molded body of the socket, wherein the contact portion of the lower contact pin is soldered to a PCB.

6. A spring contact having an upper contact pin, a lower contact pin and a spring, comprising:

an upper contact pin including: a contact portion of a predetermined shape, a body, two spring holding protrusions that are provided in left and right sides of the body so as to limit a length of an assembled spring, and two elastic portions that are provided at locations below the body;

a lower contact pin that is coupled to the upper contact pin in such a way that the upper and lower contact pins cross each other at right angles, the lower contact pin including: a contact portion of a predetermined shape, a body, two spring holding surfaces that are provided in left and right sides of the body so as to limit the length of the assembled spring, and two elastic portions; and the spring fitted over an assembly of the lower contact pin and the upper contact pin at a position between the two contact pins, wherein a thickness (t2) of each of the contact portion, the body and the two spring holding protrusions that are provided in the left and right sides of the body of the upper contact pin so as to limit the length of the assembled spring is greater than a thickness (t) of each of the two elastic portions, wherein each of ends of each of the two elastic portions of the upper contact pin and the lower contact pin has a thickness (t1) that is less than a thickness (t) of the body, with oblique surfaces, locking protrusions and locking protrusion contact surfaces being symmetrically formed in respective ends of the two elastic portions; a moving slit is defined between the two elastic portions of each of the upper and lower contact pins so as to form a moving space when the upper contact pin and the lower contact pin are coupled to each other while crossing at right angles, with a stop surface being formed on an end of the moving slit so that when the upper contact pin is compressed against the lower contact pin with a maximum force, the stop surfaces of the two contact pins come into contact with each other and stop the compression; and moving grooves are formed in the body of each of the upper and lower contact pins, so that the locking protrusions of the upper and lower contact pins, can be moved along and stopped by the moving grooves and the locking protrusion contact surfaces of the upper and lower contact pins, can be brought into electric contact with the moving grooves, the moving grooves being formed on upper and lower surfaces of each of the upper and lower contact pins, in which first ends of the moving grooves of each of the lower and upper contact pins have a stop hole that forms a stop bridge for stopping the locking protrusions of an opposite contact pin, and second ends extend in a direction toward the contact portion after passing through spring holding surfaces of the two spring holding protrusions that function to limit the length of the assembled spring and to prevent the spring from undesirably becoming displaced, wherein each of the two spring holding surfaces of the lower contact pin further extends so as to form a pin fitting part that has an assembly stop surface so as to hold the lower contact pin fitted in a molded body of a socket, with a fitting protrusion provided on an end of the pin fitting part so as to prevent the lower contact pin from being removed from the molded body of the socket after fitting the lower contact pin into the molded body of the socket, wherein the contact portion of the lower contact pin is soldered to a PCB.

7. The spring contact as set forth in claim 1, wherein the head of each of the upper and lower contact pins has a cylindrical shape, and the contact portion that is formed in an end of the head is configured to have a plurality of contact protrusions at locations around an edge of the end of the cylindrical head or is configured into any one of a hemispherical contact portion, a circular conical contact portion and a pyramidal contact portion.

8. The spring contact as set forth in claim 1, wherein the head of each of the upper and lower contact pins has a square column shape or a polygonal column shape, and the contact portion that is formed in an end of the head is configured to have a plurality of contact protrusions or is configured into a pyramidal contact portion.

9. The spring contact as set forth in claim 2, wherein the head of the upper contact pin has a cylindrical shape, and the contact portion that is formed in an end of the head is configured to have a plurality of contact protrusions at locations around an edge of the end of the cylindrical head or is configured into any one of a hemispherical contact portion, a circular conical contact portion and a pyramidal contact portion.

10. The spring contact as set forth in claim 2, wherein the head of the upper contact pin has a square column shape or a polygonal column shape, and the contact portion that is formed in an end of the head is configured to have a plurality of contact protrusions or is configured into a pyramidal contact portion.

11. The spring contact as set forth in claim 3, wherein the contact portion of the upper contact pin and the lower contact pin has a shape that is any one of a V-shape, a chamfered V-shape, a U-shape, a chamfered U-shape, an A-shape, a chamfered A-shape, a round shape and a chamfered round shape.

12. The spring contact as set forth in claim 2, wherein the contact portion of the lower contact pin has a shape that is any one of a V-shape, a chamfered V-shape, a U-shape, a chamfered U-shape, an A-shape, a chamfered A-shape, a round shape and a chamfered round shape.

13. The spring contact as set forth in claim 1, wherein the first ends of the moving grooves of each of the upper contact pin and the lower contact pin is provided with the stop bridge for stopping the locking protrusions of the opposite contact pin, but no stop hole is provided in the first ends of the moving grooves.

14. The spring contact as set forth in claim 1, wherein each of the opposite moving grooves has a predetermined depth and a thickness between bottoms of the opposite moving grooves is equal to, slightly greater than or slightly less than a distance between the contact surfaces of the locking protrusions of the two elastic portions.

15. The spring contact as set forth in claim 2, wherein each of the moving grooves of the lower contact pin extends in the direction toward the contact portion so as to reach an end of the contact portion after passing through the spring holding surfaces that are provided on lower ends of the two spring holding protrusions, so that when the upper contact pin is compressed downward against the lower contact pin, the ends of the two elastic portions of the upper contact pin reaches the contact portion of the lower contact pin or passes over the contact portion of the lower contact pin.

16. The spring contact as set forth in claim 5, wherein the contact portion of the lower contact pin is configured into a long straight contact portion that can be soldered to a PCB by a thru-hole soldering.

17. The spring contact as set forth in claim 5, wherein the contact portion of the lower contact pin is bent at an angle of 90 degrees so as to form a contact portion that can be soldered to a PCB by an angle type thru-hole soldering.

18. The spring contact as set forth in claim 5, wherein the contact portion of the lower contact pin is configured into a short straight contact portion that can be vertically surface-mounted to a PCB by a vertical SMT soldering.

19. The spring contact as set forth in claim 5, wherein the contact portion of the lower contact pin is bent twice at an angle of 90 degrees so as to form an S-shaped appearance and is configured into a contact portion that can be surface-mounted to a PCB by an angle type SMT soldering.

20. The spring contact as set forth in claim 5, wherein the head of the upper contact pin has a cylindrical shape, and the contact portion that is formed in an end of the head is configured to have a plurality of contact protrusions at locations around an edge of the end of the cylindrical head or is configured into any one of a hemispherical contact portion, a circular conical contact portion and a pyramidal contact portion.

21. The spring contact as set forth in claim 5, wherein the head of the upper contact pin has a square column shape or a polygonal column shape, and the contact portion that is formed in an end of the head is configured to have a plurality of contact protrusions or is configured into a pyramidal contact portion.

22. The spring contact as set forth in claim 4, wherein the contact portion of the upper contact pin and the lower contact pin has a shape that is any one of a V-shape, a chamfered V-shape, a U-shape, a chamfered U-shape, an A-shape, a chamfered A-shape, a round shape and a chamfered round shape.

23. The spring contact as set forth in claim 2, wherein the first ends of the moving grooves of each of the upper contact pin and the lower contact pin is provided with the stop bridge for stopping the locking protrusions of the opposite contact pin, but no stop hole is provided in the first ends of the moving grooves.

24. The spring contact as set forth in claim 3, wherein the first ends of the moving grooves of each of the upper contact pin and the lower contact pin is provided with the stop bridge for stopping the locking protrusions of the opposite contact pin, but no stop hole is provided in the first ends of the moving grooves.

25. The spring contact as set forth in claim 4, wherein the first ends of the moving grooves of each of the upper contact pin and the lower contact pin is provided with the stop bridge for stopping the locking protrusions of the opposite contact pin, but no stop hole is provided in the first ends of the moving grooves.

26. The spring contact as set forth in claim 5, wherein the first ends of the moving grooves of each of the upper contact pin and the lower contact pin is provided with the stop bridge for stopping the locking protrusions of the opposite contact pin, but no stop hole is provided in the first ends of the moving grooves.

27. The spring contact as set forth in claim 6, wherein the first ends of the moving grooves of each of the upper contact pin and the lower contact pin is provided with the stop bridge for stopping the locking protrusions of the opposite contact pin, but no stop hole is provided in the first ends of the moving grooves.

28. The spring contact as set forth in claim 2, wherein each of the opposite moving grooves has a predetermined depth and a thickness between bottoms of the opposite moving grooves is equal to, slightly greater than or slightly less than a distance between the contact surfaces of the locking protrusions of the two elastic portions.

29. The spring contact as set forth in claim 3, wherein each of the opposite moving grooves has a predetermined depth and a thickness between bottoms of the opposite moving grooves is equal to, slightly greater than or slightly less than a distance between the contact surfaces of the locking protrusions of the two elastic portions.

30. The spring contact as set forth in claim 4, wherein each of the opposite moving grooves has a predetermined depth and a thickness between bottoms of the opposite moving grooves is equal to, slightly greater than or slightly less than a distance between the contact surfaces of the locking protrusions of the two elastic portions.

31. The spring contact as set forth in claim 5, wherein each of the opposite moving grooves has a predetermined depth and a thickness between bottoms of the opposite moving grooves is equal to, slightly greater than or slightly less than a distance between the contact surfaces of the locking protrusions of the two elastic portions.

32. The spring contact as set forth in claim 6, wherein each of the opposite moving grooves has a predetermined depth and a thickness between bottoms of the opposite moving grooves is equal to, slightly greater than or slightly less than a distance between the contact surfaces of the locking protrusions of the two elastic portions.

33. The spring contact as set forth in claim 4, wherein each of the moving grooves of the lower contact pin extends in the direction toward the contact portion so as to reach an end of the contact portion after passing through the spring holding surfaces that are provided on lower ends of the two spring holding protrusions, so that when the upper contact pin is compressed downward against the lower contact pin, the ends of the two elastic portions of the upper contact pin reaches the contact portion of the lower contact pin or passes over the contact portion of the lower contact pin.

34. The spring contact as set forth in claim 6, wherein the contact portion of the lower contact pin is configured into a long straight contact portion that can be soldered to a PCB by a thru-hole soldering.

35. The spring contact as set forth in claim 6, wherein the contact portion of the lower contact pin is bent at an angle of 90 degrees so as to form a contact portion that can be soldered to a PCB by an angle type thru-hole soldering.

36. The spring contact as set forth in claim 6, wherein the contact portion of the lower contact pin is configured into a short straight contact portion that can be vertically surface-mounted to a PCB by a vertical SMT soldering.

37. The spring contact as set forth in claim 6, wherein the contact portion of the lower contact pin is bent twice at an angle of 90 degrees so as to form an S-shaped appearance and is configured into a contact portion that can be surface-mounted to a PCB by an angle type SMT soldering.

* * * * *